United States Patent
Gibson et al.

(10) Patent No.: US 11,954,419 B2
(45) Date of Patent: Apr. 9, 2024

(54) DYNAMIC ALLOCATION OF COMPUTING RESOURCES FOR ELECTRONIC DESIGN AUTOMATION OPERATIONS

(71) Applicant: Siemens Industry Software Inc., Plano, TX (US)

(72) Inventors: Patrick D. Gibson, Tualatin, OR (US); Robert A. Todd, Beaverton, OR (US); Jimmy J. Tomblin, Santa Rosa Beach, FL (US)

(73) Assignee: Siemens Industry Software Inc., Plano, TX (US)

( * ) Notice: Subject to any disclaimer, the term of this patent is extended or adjusted under 35 U.S.C. 154(b) by 470 days.

(21) Appl. No.: 17/281,649

(22) PCT Filed: Oct. 22, 2018

(86) PCT No.: PCT/US2018/056877
§ 371 (c)(1),
(2) Date: Mar. 31, 2021

(87) PCT Pub. No.: WO2020/086053
PCT Pub. Date: Apr. 30, 2020

(65) Prior Publication Data
US 2021/0374319 A1  Dec. 2, 2021

(51) Int. Cl.
*G06F 30/398* (2020.01)
*G06F 9/48* (2006.01)
(Continued)

(52) U.S. Cl.
CPC .......... *G06F 30/398* (2020.01); *G06F 9/4881* (2013.01); *G06F 9/5027* (2013.01);
(Continued)

(58) Field of Classification Search
CPC ...... G06F 30/398; G06F 30/20; G06F 30/337; G06F 30/373; G06F 9/4881; G06F 9/5027
(Continued)

(56) References Cited

U.S. PATENT DOCUMENTS 6,625,638 B1 * 9/2003 Kubala ................. G06F 9/5083
711/173
6,865,591 B1 * 3/2005 Garg .................... H04L 67/1031
709/201
(Continued)

FOREIGN PATENT DOCUMENTS

CN          1955931 A     5/2007
CN        101288049 A    10/2008
(Continued)

OTHER PUBLICATIONS

PCT International Search Report and Written Opinion of International Searching Authority dated Jul. 15, 2019 corresponding to PCT International Application No. PCT/US2018/056877 filed Oct. 22, 2018.

*Primary Examiner* — Phallaka Kik

(57) ABSTRACT

A system may include a set of compute engines. The compute engines may be configured to perform electronic design automation (EDA) operations on a hierarchical dataset representative of an integrated circuit (IC) design. The system may also include a dynamic resource balancing engine configured to allocate computing resources to the set of compute engines and reallocate a particular computing resource allocated to a first compute engine based on an operation priority of an EDA operation performed by a second compute engine, an idle indicator for the first compute engine, or a combination of both.

12 Claims, 5 Drawing Sheets

(51) Int. Cl.
  *G06F 9/50* (2006.01)
  *G06F 30/20* (2020.01)
  *G06F 30/337* (2020.01)
  *G06F 30/373* (2020.01)

(52) U.S. Cl.
  CPC ............ *G06F 30/20* (2020.01); *G06F 30/337* (2020.01); *G06F 30/373* (2020.01)

(58) Field of Classification Search
  USPC .......................... 716/132, 111, 136; 703/16
  See application file for complete search history.

(56) References Cited

U.S. PATENT DOCUMENTS

| | | | | |
|---|---|---|---|---|
| 6,937,969 | B1* | 8/2005 | Vandersteen | G06F 30/367 703/19 |
| 7,051,188 | B1* | 5/2006 | Kubala | G06F 9/5077 718/104 |
| 8,365,177 | B2* | 1/2013 | Chan | G06F 9/4881 718/103 |
| 8,548,790 | B2* | 10/2013 | Tylutki | G06F 11/3442 718/1 |
| 8,706,798 | B1* | 4/2014 | Suchter | H04L 47/83 709/224 |
| 10,492,023 | B1* | 11/2019 | Gurin | G06F 21/602 |
| 10,884,778 | B1* | 1/2021 | Dunagan | G06F 9/45558 |
| 11,354,164 | B1* | 6/2022 | Dennis | G06F 9/5077 |
| 11,811,680 | B2* | 11/2023 | Jain | H04L 41/5048 |
| 11,822,971 | B2* | 11/2023 | Macha | G05B 19/41845 |
| 2003/0139838 | A1* | 7/2003 | Marella | H01L 22/20 716/112 |
| 2003/0182348 | A1* | 9/2003 | Leong | G06F 9/524 718/100 |
| 2006/0036735 | A1* | 2/2006 | Gasca | G06F 9/5061 709/226 |
| 2006/0143390 | A1* | 6/2006 | Kottapalli | G06F 12/126 711/E12.075 |
| 2011/0161972 | A1* | 6/2011 | Dillenberger | G06F 9/52 718/104 |
| 2012/0284492 | A1* | 11/2012 | Zievers | H04L 49/15 713/1 |
| 2013/0086543 | A1* | 4/2013 | Agarwal | G06F 30/392 716/119 |
| 2013/0214408 | A1* | 8/2013 | Zhao | H01L 21/486 257/737 |
| 2014/0195673 | A1* | 7/2014 | Cook | H04L 67/10 709/224 |
| 2014/0310722 | A1* | 10/2014 | McGaughy | G06F 9/5066 718/105 |
| 2015/0006140 | A1* | 1/2015 | Parikh | G06Q 50/06 703/18 |
| 2015/0089511 | A1* | 3/2015 | Smith | G06F 9/485 718/104 |
| 2015/0095918 | A1* | 4/2015 | Alameldeen | G06F 12/0842 718/104 |
| 2015/0286492 | A1* | 10/2015 | Breitgand | G06F 9/45558 718/1 |
| 2015/0363527 | A1* | 12/2015 | McGaughy | G06F 30/20 703/2 |
| 2016/0210154 | A1* | 7/2016 | Lin | G06F 9/38 |
| 2016/0210174 | A1* | 7/2016 | Hsieh | G06F 9/5038 |
| 2016/0294728 | A1* | 10/2016 | Jain | H04L 47/82 |
| 2016/0378545 | A1* | 12/2016 | Ho | G06F 9/4843 718/107 |
| 2017/0061054 | A1* | 3/2017 | Kalafala | G06F 30/3312 |
| 2017/0083077 | A1* | 3/2017 | Hankendi | G06F 1/329 |
| 2017/0192887 | A1* | 7/2017 | Herdrich | G06F 12/0895 |
| 2017/0262320 | A1* | 9/2017 | Newburn | G06F 9/5038 |
| 2018/0052711 | A1* | 2/2018 | Zhou | G06F 9/5038 |
| 2018/0121103 | A1* | 5/2018 | Kavanagh | H04L 47/805 |
| 2018/0137031 | A1* | 5/2018 | Jain | G06F 11/3656 |
| 2018/0145871 | A1* | 5/2018 | Golin | H04L 51/48 |
| 2018/0173090 | A1* | 6/2018 | Wang | G03F 1/36 |
| 2019/0034326 | A1* | 1/2019 | Nalluri | G06T 1/60 |
| 2019/0340034 | A1* | 11/2019 | Saballus | G06F 9/5083 |
| 2019/0361753 | A1* | 11/2019 | Macha | H04L 67/1034 |
| 2020/0005127 | A1* | 1/2020 | Baum | G06F 7/785 |
| 2020/0026564 | A1* | 1/2020 | Bahramshahry | G06Q 10/06316 |
| 2020/0050530 | A1* | 2/2020 | Orth | G06F 11/3419 |
| 2020/0073717 | A1* | 3/2020 | Hari | G06F 9/5061 |
| 2020/0111713 | A1* | 4/2020 | Zang | H01L 21/76831 |
| 2020/0218534 | A1* | 7/2020 | Lim | G06F 8/71 |
| 2020/0241921 | A1* | 7/2020 | Calmon | G06N 3/045 |

FOREIGN PATENT DOCUMENTS

| | | |
|---|---|---|
| CN | 105718318 A | 6/2016 |
| CN | 108293011 A | 7/2018 |

* cited by examiner

DYNAMIC ALLOCATION OF COMPUTING RESOURCES FOR ELECTRONIC DESIGN AUTOMATION OPERATIONS

BACKGROUND

Electronic circuits, such as integrated microcircuits, are used in nearly every facet of modern society from automobiles to microwaves to personal computers. Design of microcircuits may involve many steps, known as a "design flow." The particular steps of a design flow often are dependent upon the type of microcircuit being designed, its complexity, the design team, and the microcircuit fabricator or foundry that will manufacture the microcircuit. Electronic design automation (EDA) applications support the design and verification of circuits prior to fabrication. EDA applications may include various functions, tools, or features to test or verify a design at various stages of the design flow, e.g., through execution of software simulators and/or hardware emulators for error detection.

SUMMARY

Disclosed implementations include systems, methods, devices, and logic that may support dynamic allocation of computing resources for EDA operations.

In one example, a method may be performed, executed, or otherwise carried out by a computing system. The method may include allocating computing resources to a set of compute engines, each compute engine configured to perform EDA operations on a hierarchical dataset representative of an integrated circuit (IC) design and dynamically reallocating a particular computing resource from a first compute engine to a compute second engine based on an operation priority of an EDA operation executed by the second compute engine, an idle indicator for the first compute engine, or a combination of both.

In another example, a system may include a set of compute engines, and each compute engine may be configured to perform EDA operations on a hierarchical dataset representative of an IC design. The system may also include a dynamic resource balancing engine configured to allocate computing resources to the set of compute engines and reallocate a particular computing resource allocated to a first compute engine based on an operation priority of an EDA operation performed by a second compute engine, an idle indicator for the first compute engine, or a combination of both.

In yet another example, a non-transitory machine-readable medium may store processor-executable instructions. When executed, the instructions may cause a system to allocate computing resources to a set of compute engines, each compute engine configured to perform EDA operations on a hierarchical dataset representative of a circuit design and dynamically reallocate a particular computing resource from a first compute engine to a second compute engine based on an operation priority of an EDA operation executed by the second compute engine, an idle indicator for the first compute engine, or a combination of both.

BRIEF DESCRIPTION OF THE DRAWINGS

Certain examples are described in the following detailed description and in reference to the drawings.

DETAILED DESCRIPTION

The following disclosure relates to EDA applications and CAD systems which may be used to facilitate the design and manufacture of circuits. As technology improves, modern circuit designs may include billions of components and more. To support increasing degrees of circuit design complexity, EDA applications may include various features such as high-level synthesis, schematic capture, transistor or logic simulation, field solvers, functional and physical verifications, geometry processing, equivalence checking, design rule checks, mask data preparation, and more.

Execution of EDA applications and processes may require significant computational resources, and computing environments may vary between different entities using EDA applications for circuit design and verification. Computing environments configured to execute EDA applications and processes may range from 16 CPUs, to 10,000 of CPUs, to more. As circuit designs continue to increase in complexity, the computational requirements of EDA applications may continue to increase. As such, improvements in the computational performance and capability of computing systems used to execute EDA applications may provide significant technical benefits.

The features described herein may support dynamic allocation of computing resources for execution of EDA operations. In particular, the dynamic resource allocation features (also referred to as dynamic resource balancing features) described herein may provide specific criteria and mechanisms by which computing resources can be dynamically distributed during execution of EDA processes and underlying EDA operations. The various dynamic load balancing features described herein may be specific to EDA processes for circuit design, and example load balancing criteria include EDA operation-based resource reallocations and idle-based resource reallocations (e.g., at execution tails of EDA operations). Such dynamic resource balancing specific to EDA operations may increase the computational efficiency and effectiveness of EDA computing systems.

Figure 1:
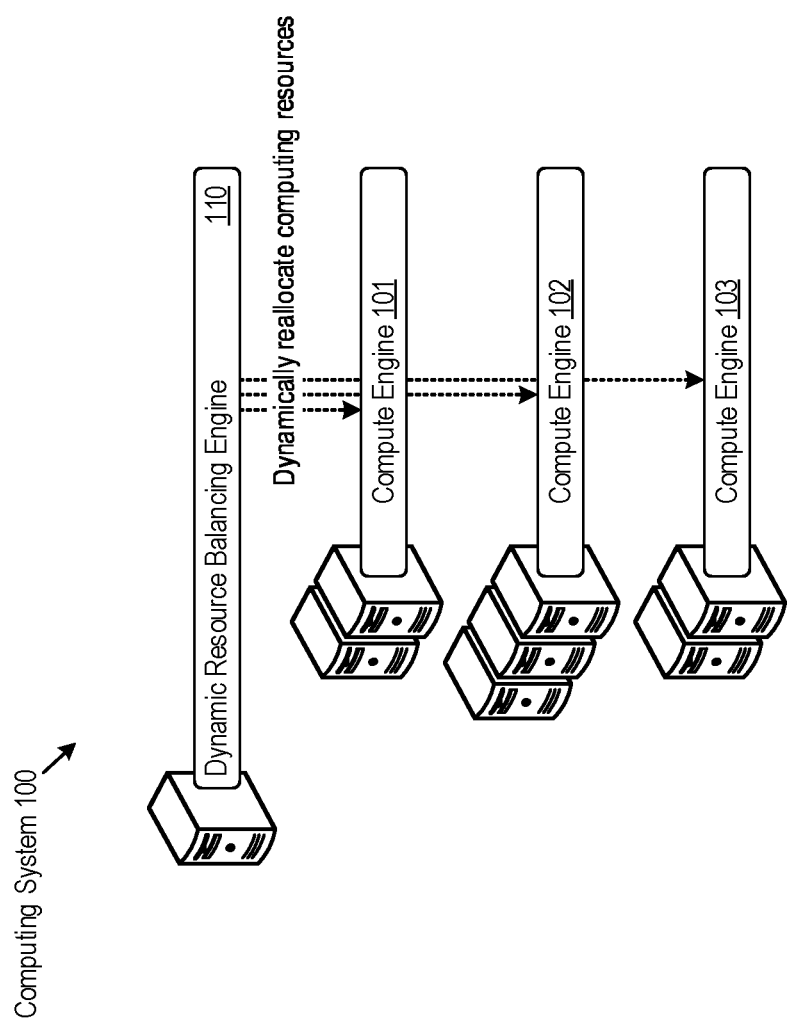
FIG. 1 shows an example of a computing system that supports dynamic allocation of computing resources for EDA operations.

FIG. 1 shows an example of a computing system 100 that supports dynamic allocation of computing resources for EDA operations. The computing system 100 may include a single or multiple computing devices such as application servers, compute nodes, data servers, desktop or laptop computers, smart phones or other mobile devices, tablet devices, embedded controllers, and more. The computing system 100 may include capabilities to dynamically reallocate computing resources among different compute engines that perform EDA processes and operations on a circuit design, doing so based on specific EDA operation priorities or execution states.

In connection with the various dynamic resource balancing features described herein, the computing system 100 may implement, utilize, or otherwise support dynamic resource allocation as described in U.S. patent application Ser. No. 15/873,827 filed on Jan. 17, 2018 and titled "DYNAMIC DISTRIBUTED RESOURCE MANAGEMENT" (the '827 application), which is incorporated herein by reference in its entirety. Computing resources used and allocated by the computing system 100 may be maintained and allocated according to the various dynamic allocation mechanisms as described in the '827 application and in accordance with the various criteria and resource balancing features described herein.

The computing system 100 may include various computing resources to execute EDA processes and operations. As an example implementation, the computing system 100 shown in FIG. 1 includes compute engines 101, 102, and 103. The compute engines 101, 102, and 103 may serve as separate entities (whether physically or logically) capable of performing EDA computations for an EDA process (e.g., a design-rule-check process or optical proximity correction process).

Each compute engine may be implemented as a combination of hardware and software, and may thus include physical computing resources (e.g., CPUs, memory, network resources, etc.) and processor-executable instructions (e.g., workflow processes, instruction scheduling logic, resource acquisition or thread activation instructions, etc.) to support EDA computations. In operation, the compute engines may operate in parallel, for example each serving as command servers that perform EDA operations on specific portions of an IC design or perform specific sets of EDA operations to provide parallelism and operation-level concurrency in EDA process execution. For example, the compute engines 101, 102 and 103 shown in FIG. 1 may perform EDA operations on a hierarchical dataset representative of an IC design.

EDA applications may be executed in various type of computing environments, including in whole or in part via cloud computing. As such, the computing system 100 (including the compute engines 101, 102, and 103) may be implemented in part via a public cloud, private cloud, or hybrid cloud. Additionally or alternative, EDA applications may be executed via a software-as-a-service ("SaaS") distribution model (whether in whole or in part), and the computing resources that comprise the computing system 100 may be off-premise (e.g., with regards to EDA application users), on-premise, or a combination of both. The various EDA features described herein may be implemented as part of a SaaS distribution model or via cloud computing implementations.

As described in greater detail herein, the computing system 100 may dynamically balance computing resources assigned to different compute engines according to various balancing criteria. In doing so, the computing system 100 may increase computational efficiency by reallocating computing resources (e.g., physical CPUs, memory, or any other computational resource used for operation execution) according to a priority of EDA operations, idle compute engines, or various other factors. Such dynamic resource allocation and balancing may be performed by a dynamic resource balancing engine 110, e.g., as shown in FIG. 1.

The computing system 100 may implement the dynamic resource balancing engine 110 (and components thereof) in various ways, for example as hardware and programming. The programming for the dynamic resource balancing engine 110 may take the form of processor-executable instructions stored on a non-transitory machine-readable storage medium and the hardware for the dynamic resource balancing engine 110 may include a processor to execute those instructions. A processor may take the form of single processor or multi-processor systems, and in some examples, the computing system 100 implements multiple engine components or system elements using the same computing system features or hardware components (e.g., a common processor or common storage medium for the dynamic resource balancing engine 110 and compute engines 101, 102, and 103).

In operation, the dynamic resource balancing engine 110 may allocate computing resources to a set of compute engines, such as the compute engines 101, 102, and 103. As used herein, a computing resource may include any physical or logical resource that used for execution of an EDA operation. Computing resources may thus include physical CPUs (including remote resources), network adapters, I/O bandwidth, memory (physical or virtual), scheduling slots for use of particular computational elements, etc. In operation, the dynamic resource balancing engine 110 may also reallocate a particular computing resource allocated to a first compute engine (e.g., compute engine 101) based on an operation priority of an EDA operation performed by a second compute engine (e.g., compute engine 102), an idle indicator for the first compute engine, or a combination of both.

These and other dynamic resource balancing features are described in greater detail next. Various balancing criteria are described specific to execution of EDA applications, including computing resource reallocations based on specific EDA operations or operation types, idle-based reallocations (e.g., at EDA operation tails), and others.

Figure 2:
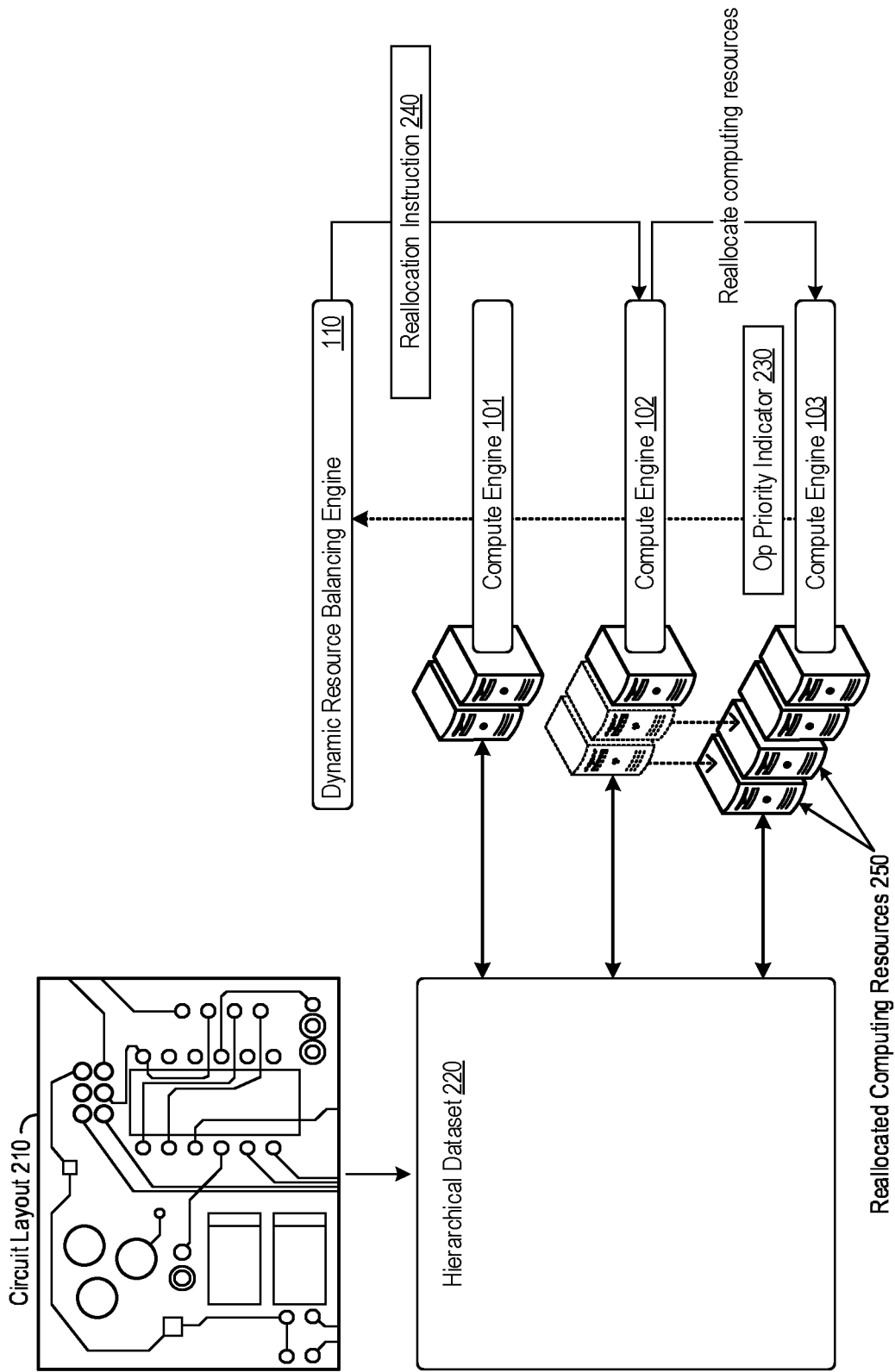
FIG. 2 shows an example of an EDA operation-based resource reallocation by a dynamic resource balancing engine.

FIG. 2 shows an example of an EDA operation-based resource reallocation by the dynamic resource balancing engine 110. In the example shown in FIG. 2, a computing system may execute an EDA operation that performs various EDA operations for a circuit layout 210. The circuit layout 210 may be any representation of a circuit design such as an integrated circuit, a system-on-a-chip (SOC), a printed circuit board (PCB), etc. Such a computing system may support representation of the circuit layout 210 in a hierarchical format, for example as the hierarchical dataset 220 shown in FIG. 2.

The hierarchical dataset 220 may take the form of any hierarchical representation of a circuit design (e.g., the circuit layout 210). In that regard, the hierarchical dataset 220 (which may be in the form of a hierarchical database) may include various hierarchies in circuit representation to provide computational efficiencies. Hierarchies in the hierarchical dataset 220 may include hierarchies of design elements (e.g., combination of individual circuit structures into larger circuit structures), of stacking order of individual layers in an integrated circuit, or in other hierarchical forms.

In some instances, the hierarchical dataset 220 may include various design cells that represent the circuit layout in a cell-based hierarchical structure. Hierarchical cells may encapsulate individual design structures (e.g., electrode contacts) which can be grouped to form other hierarchical cells (e.g., NAND gates) on a higher hierarchical layer, which may be further grouped into other hierarchical cells on yet other higher hierarchical layers. In such a way, the hierarchical dataset 220 may represent various design hierarchies in the circuit layout 210. Such hierarchical structures may support parallelism and operational-level concurrency for EDA application executions.

The dynamic resource balancing engine 110 may allocate computing resources for performing EDA operations on the hierarchical dataset 220, or delineated portions thereof. In some examples, the dynamic resource balancing engine 110 identifies specific sections of the hierarchical dataset 220 (e.g., specific layers or hierarchical cells) to assign to different compute engines for EDA computations. Additionally or alternatively, the dynamic resource balancing engine 110 may issue different EDA operations for execution on the hierarchical dataset 220 (or selected portions thereof) to different compute engines. As such, the compute engine 101 may perform a first EDA operation on a portion of the hierarchical dataset 220 (e.g., a multi-patterning color operation on a metal 1 layer of the circuit layout 210) whereas the compute engine 102 may (simultaneously) perform a second EDA operation on a different portion of the hierarchical dataset 220 (e.g., a design-rule-check operation on a metal 2 layer of the circuit layout 210).

EDA operations may vary in computational complexity and some EDA operations may use (e.g., consume) outputs generated from other EDA operations. That is, EDA operations may have different timing, computing, or dependency requirements. To address such differences in requirements and complexity, the dynamic resource balancing engine 110 may reallocate resources among compute engines to prioritize execution of selected EDA operations. Such re-provisioning of computing resources among compute engines for execution of an EDA application may be based on preconfigured or determined EDA operation priorities.

To illustrate, upon instantiation of an EDA application, the dynamic resource balancing engine 110 may assign the compute engines 101, 102, and 103 a fixed set of computing resources to use for execution of the EDA operations assigned to each respective compute engine. At any point during execution of the EDA application, the dynamic resource balancing engine 110 may reallocate computing resources assigned to a given compute engine to a different compute engine based on the operation priorities of the EDA operation executed by the given compute engine, the different compute engine, or both.

As a particular example, the dynamic resource balancing engine 110 may prioritize EDA operations in a critical execution path of EDA processes of an EDA application. Various EDA processes may be performed on the hierarchical dataset 220 such as layout-versus-schematic (LVS) verifications, design rule checks (DRC), design for manufacturing (DFM) processes, and optical proximity corrections (OPC) to name a few. Each such EDA process may include a critical execution path of EDA operations, particularly when executed upon the hierarchical dataset 220. The critical execution path may represent a critical path of execution time for execution of an EDA process (e.g., the sequence of EDA operations in the EDA process with the longest execution time).

The dynamic resource balancing engine 110 may determine the critical execution path of a particular EDA process (e.g., a LVS verification) through a graph analysis in the various EDA operations that comprise the particular EDA process. For instance, the dynamic resource balancing engine 110 may represent the EDA process as a graph, each node representing EDA operations on different hierarchical portions of a circuit design, with edges between nodes representing input dependencies and including traversal (e.g., computational) costs. As such, the dynamic resource balancing engine 110 may determine or otherwise identify a critical execution path for execution of an EDA process.

During execution of the EDA process, the dynamic resource balancing engine 110 may provision additional computing resources to any compute engine(s) executing EDA operations in the critical execution path of an EDA process. To do so, the dynamic resource balancing engine 110 may identify a particular compute engine performing an EDA operation on a critical execution path (e.g., of an EDA process) and reallocate computing resources assigned to a different compute engine executing an EDA operation that is not on the critical execution path.

In some examples, a compute engine itself may provide an indication of operation priority to the dynamic resource balancing engine 110. In FIG. 2, the compute engine 103 provides an operation priority indicator 230 to the dynamic resource balancing engine 110, which may indicate that the EDA operation executed by the compute engine 103 is on a critical execution path. In other examples (e.g., as described above), the dynamic resource balancing engine 110 itself may determine critical execution paths and determine which compute engine(s) are executing EDA operations along the critical execution path.

Responsive to a determination that the compute engine 103 (in this example) is executing an EDA operation on a critical execution path, the dynamic resource balancing engine 110 may reallocate computing resources from other compute engines to the compute engine 103. In the example shown in FIG. 3, the dynamic resource balancing engine 110 sends a reallocation instruction 240 to the compute engine 102, in response to which the computing engine 102 may release computing resources for acquisition/use by compute engine 103. FIG. 2 illustrates the reallocated computing resources 250, which may be released by the compute engine 102 and acquired by the compute engine 103 responsive to a reallocation instruction 240 issued by the dynamic resource balancing engine 110.

In some implementations, the dynamic resource balancing engine 110 may reallocate computing resources based on specific EDA operation types. As EDA operations may vary in computational complexity, the dynamic resource balancing engine 110 may prioritize EDA operations with higher computational complexities, latencies, or timing requirements. Such operation priorities may be specified through operation priority indicator messages sent from compute engines (e.g., as part of the operation priority indicator 230), which may specify a prioritized EDA operation type being executed by a compute engine. The dynamic resource balancing engine 110 may issue reallocation instructions 240 responsive to receiving the operation priority indicator 230 from the compute engine 103 indicative of a high-priority EDA operation being executed by the compute engine 103.

EDA operation priority may be specified, identified, or determined in various ways. In some examples, the dynamic resource balancing engine 110 maintains a priority list of EDA operation types, and such a priority list may be user-configurable or preconfigured. In other examples, the dynamic resource balancing engine 110 may implement or consult specific load balancing criteria, which may specify particular EDA operations (or EDA operation types) and corresponding resource reallocation actions. As particular example EDA operation types, the dynamic resource balancing engine 110 may allocate additional computing resources to a compute engine executing fill operations, multi-patterning operations, high-performance compute (HPC) operations, or any other EDA operations identified otherwise specified as computationally complex. On the other hand, the dynamic resource balancing engine 110 may deallocate computing resources for less computationally complex EDA operations, for example by reassigning a subset of computing resources assigned to compute engines executing Boolean-based EDA operations or other EDA operations with lesser complexity or reduced computational requirements or dependencies.

In some instances, the dynamic resource balancing engine 110 may determine EDA operation priority based on a particular hierarchal level an EDA operation is operating on. As one example, the dynamic resource balancing engine 110 may prioritize resource allocations for various layers of an IC design differently. The dynamic resource balancing engine 110 may prioritize front-end align layers of an IC design higher than other layers, e.g., by reallocating a computing resource to a compute engine that executes an EDA operation on a metal 1 or metal 2 layer from another compute engine that executes an EDA operation on a metal 10 layer, as one particular example. Such hierarchical-level based priorities and resource reallocations may be configured by a system administrator to allocate additional computing resources to hierarchical levels with specific physical characteristics (thicker IC layers with increased computational requirements, such as metal 1 and metal 2 layers) or hierarchical levels which are computationally complex/resource intensive in terms of processing requirements.

As yet another example of EDA operation-based priority, the dynamic resource balancing engine 110 may prioritize EDA operations with reduced-parallelization capability. In some implementations, compute engines may instantiate other compute engines to perform a sub-portion of EDA operations. In such cases, the compute engine may act, in effect, as a command server to initiate execution threads (e.g., through acquisition of local or remote computing resources) to process EDA operations or portions thereof. Such an instantiating compute engine may be referred to as a command compute engine. The compute engines instantiated by the command compute engine (which may be referred to as instantiated-compute engines) may operate on a selected dataset apportioned by the command compute engine. These instantiated compute engines may increase parallelism and support operation-level concurrency to more efficiently perform EDA operations on the hierarchical dataset 220 as logically separate execution units.

In some implementations, instantiated compute engines need not access or have knowledge to the different hierarchies of data in the hierarchical dataset 220, instead executing EDA operations on a data subset provided by the command compute engine. However, some EDA operations may specifically require hierarchical knowledge or cross multiple hierarchical layers, and thus may not be suitable for independent execution by the instantiated compute engines. Such EDA operations may require access to the hierarchical dataset 220, and may require execution by the command compute engine itself instead of instantiated pseudo compute engines. In such scenarios, the dynamic resource balancing engine 110 may prioritize execution of these hierarchy-dependent EDA operations by allocating additional compute resources to a command compute engine, e.g., by drawing from computing resources allocated to the instantiated compute engines or other compute engines executing lower-priority EDA operations.

As described above, the dynamic resource balancing engine 110 may dynamically vary computing resources assigned to different compute engines that execute an EDA application. By leveraging operation-level concurrency and using balancing criteria based on operation priority (whether explicitly set for specific operation-types or based on a critical execution path), the dynamic resource balancing engine 110 may improve EDA computing systems to reduce execution times, increase operational efficiency, and reduce overall resource consumption. Such dynamic resource balancing may reduce EDA application execution times by 10% or more, thus improving computing efficiency of EDA computing systems.

While various individual balancing criteria are described above, the dynamic resource balancing engine 110 may utilize any of the described balancing criteria in combination. Additionally or alternatively, the dynamic resource balancing engine 110 may reallocate computing resources amongst various compute engines to efficiently use idle resources at various junctures of EDA operation execution, for example as described next in FIG. 3.

Figure 3:
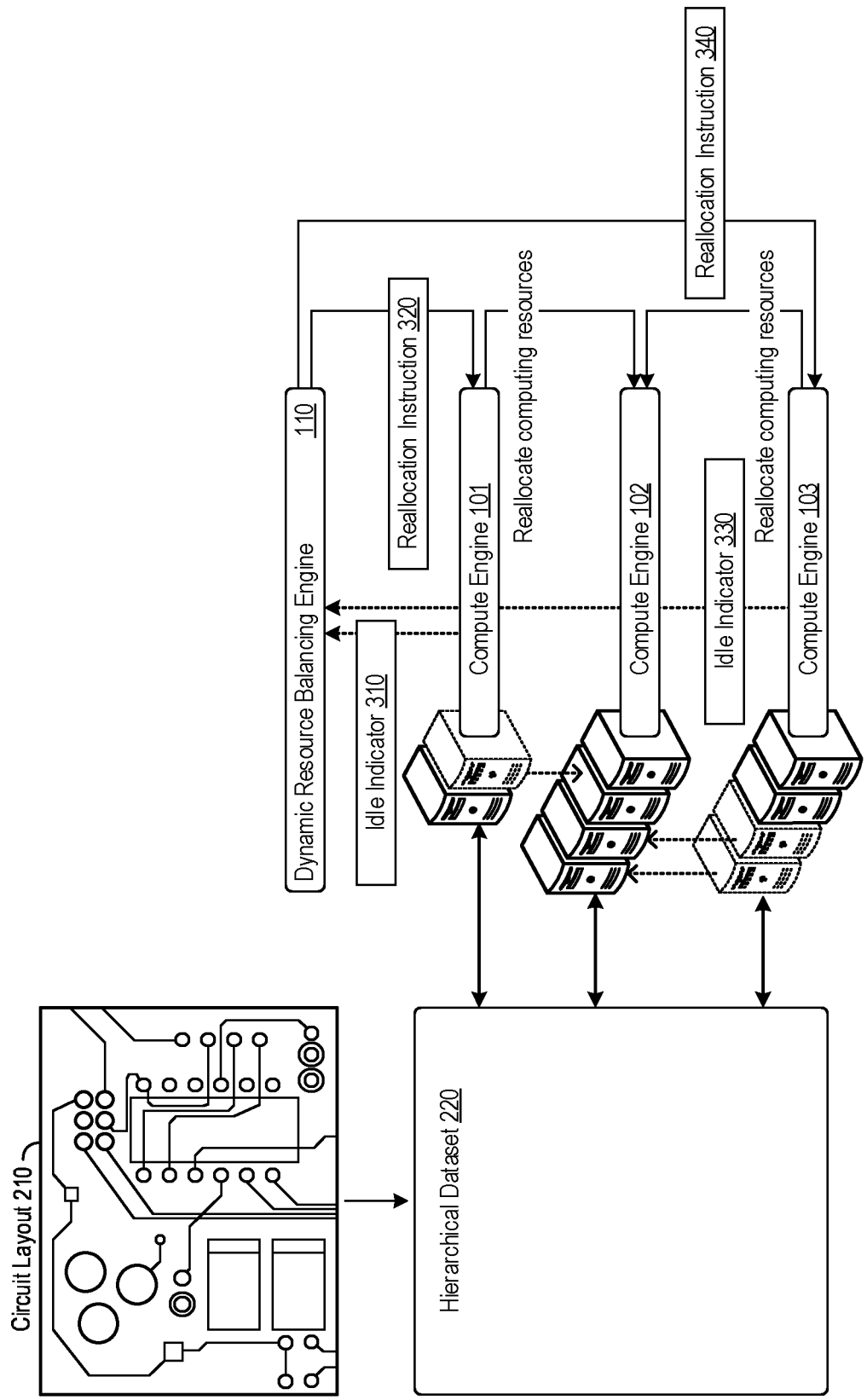
FIG. 3 shows an example of an idle-based resource reallocation by the dynamic resource balancing engine.

FIG. 3 shows an example of an idle-based resource reallocation by the dynamic resource balancing engine 110. In FIG. 3, the compute engine 101, 102, and 103 execute EDA operations on the hierarchical dataset 220, which may provide a hierarchical representation of the circuit layout 210. In particular, the dynamic resource balancing engine 110 may identify when various compute engines have idle (e.g., unused) computing resources, and reallocate any such idle computing resources accordingly.

Compute engines may include underutilized or idle computing resources at various points during EDA operation execution. Such points can include the execution tail of EDA processes in an EDA application. To illustrate, different compute engines (e.g., the compute engines 101, 102, and 103) may serve as command compute engines each assigned to execute various EDA processes, each of which may include an associated set of EDA operations. The command compute engines may instantiate other compute engines to help perform the EDA processes, doing so to increase parallelism and operation concurrency. As each command compute engine (and respectively instantiated compute engines) execute different EDA processes, the dynamic resource balancing engine 110 (or a command compute engine itself) may continually reallocate resources as these compute engines finish execution of assigned EDA operations.

As a compute engine nears completion of an EDA operation or EDA process (e.g., during an execution tail), there may be decreased opportunities for parallelism as a critical execution path may require serial execution of EDA operations. Such EDA operations executed at the end of an EDA process may be referred to as an EDA operation tail, which may result in unused computing resources during EDA operation execution. In some cases, the "tail" of EDA operation execution or the EDA operation tail may refer to the last 10% of the execution time or the last 10% of an EDA instruction set, though other percentages or gauge to measure the end of an EDA operation sequence are contemplated as well.

A scenario may occur when multiple command compute engines reach the execution tail of EDA processes, during which the dynamic resource balancing engine 110 may reallocate idle computing resources to other compute engines to increase computational efficiency. In that regard, the dynamic resource balancing engine 110 may increase the overall utilization of computing resources in a computing environment, particularly during the "tail" of EDA operation execution.

In operation, the dynamic resource balancing engine 110 may identify idle or unused computing resources during an EDA operation tail in various ways. In some implementations, the dynamic resource balancing engine 110 polls the various compute engines of a computing system to determine resource utilization rates. Such polling may occur at periodic or irregular (e.g., user triggered) times. As another example, the compute engines themselves may communicate idle indicators to alert the dynamic resource balancing engine 110 of idle computing resources of a computing engine.

Examples of idle indicators are illustrated in FIG. 3. In FIG. 3, the compute engine 101 sends an idle indicator 310 to the dynamic resource balancing engine 110. The idle indicator 310 may take the form of any communication that indicates a compute engine has idle/unused computing resources. In some instances, the idle indicator 310 may specify the specific computing resources allocated to the compute engine 101 that are unused or a utilization percentage (e.g., 60% utilization rate, which may indicate 40% of assigned computing resources can be reallocated).

In response, the dynamic resource balancing engine 110 may send a reallocation instruction 320 to the compute engine 101, which in FIG. 3 causes the compute engine 101 to release computing resources that are subsequently acquired by compute engine 102. In a similar manner, the compute engine 103 may send an idle indicator 330 to the dynamic resource balancing engine 110. In response to the idle indicator 330, the dynamic resource balancing engine 110 may issue the reallocation instruction 340 to the compute engine 103, whereupon the compute engine 103 may release computing resources that are subsequently acquired by the compute engine 102.

In the example shown in FIG. 3, the compute engines 101 and 103 may be at execution point that is part of an EDA operation "tail", as the EDA processes executed by the compute engines 101 and 103 near or reach completion. Unused computing resources may be identified and reallocated by the dynamic resource balancing engine 110 to other compute engines that have yet to reach an EDA operation "tail", in this case the compute engine 102. By doing so, the dynamic resource balancing engine 110 may increase the execution efficiency of EDA applications by providing increased computing capabilities to the compute engine 102, doing so without reducing the computational efficiency of the compute engines 101 and 103 (which may only require a subset of computing resources during execution of the EDA operation tail).

While various resource balancing examples are described with respect to EDA operation tails, the dynamic resource balancing engine 110 may reallocate resources for compute engines with any idle computing resources at any point in time. By doing so, the dynamic resource balancing engine 110 may increase computational efficiency and increase resource utilization, which may improve the computing output and operation of EDA systems.

As described above, the dynamic resource balancing engine 110 may dynamically reallocate computing resources during execution of an EDA application. Moreover, the dynamic resource balancing engine 110 may support any of the described dynamic resource balancing features whether compute engines have idle/unused computing resources or not (e.g., EDA operation-based reallocations when computing resources are fully utilized). By flexibly supporting such resource reallocations specific execution of EDA operations, the dynamic resource balancing engine 110 may provide the various technical benefits described herein.

Figure 4:
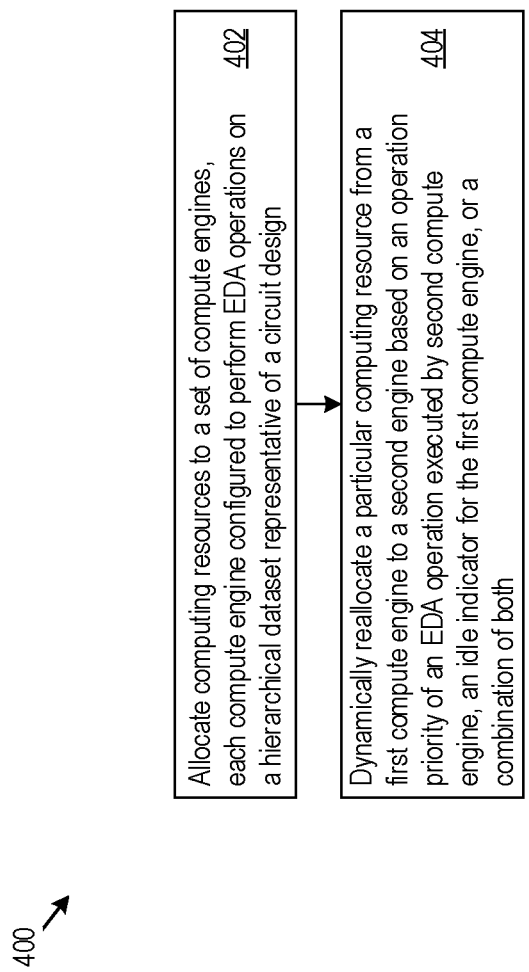
FIG. 4 shows an example of logic that a system may implement to support dynamic allocation of computing resources for EDA operations.

FIG. 4 shows an example of logic 400 that a system may implement to support dynamic allocation of computing resources for EDA operations. In some examples, the computing system 100 may implement the logic 400 as hardware, executable instructions stored on a machine-readable medium, or as a combination of both. The computing system 100 may implement the logic 400 via the dynamic resource balancing engine 110, for example, through which the computing system 100 may perform or execute the logic 400 as a method to support dynamic allocation of computing resources for EDA operations. The following description of the logic 400 is provided using the dynamic resource balancing engine 110 as an implementation example. However, various other implementation options by a system are possible.

In implementing the logic 400, the dynamic resource balancing engine 110 may allocate computing resources to a set of compute engines, each compute engine configured to perform EDA operations on a hierarchical dataset representative of a circuit design (402). The dynamic resource balancing engine 110 may further dynamically reallocate a particular computing resource from a first compute engine to a second compute engine based on an operation priority of an EDA operation executed by the second compute engine, an idle indicator for the first compute engine, or a combination of both (404).

While an example dynamic resource balancing features are shown and described through FIG. 4, the logic 400 may include any number of additional or alternative steps as well. The logic 400 may additionally or alternatively implement any other dynamic resource balancing features described herein, for example any with respect to the dynamic resource balancing engine 110.

Figure 5:
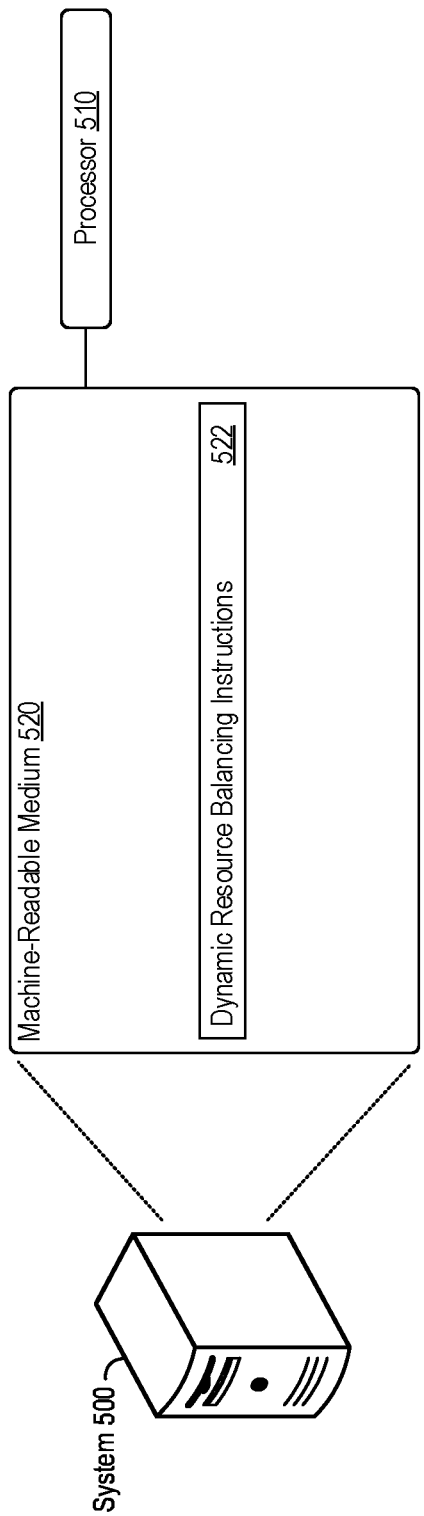
FIG. 5 shows an example of a system that supports dynamic allocation of computing resources for EDA operations.

FIG. 5 shows an example of a system 500 that supports dynamic allocation of computing resources for EDA operations. The system 500 may include a processor 510, which may take the form of a single or multiple processors. The processor(s) 510 may include a central processing unit (CPU), microprocessor, or any hardware device suitable for executing instructions stored on a machine-readable medium. The system 500 may include a machine-readable medium 520. The machine-readable medium 520 may take the form of any non-transitory electronic, magnetic, optical, or other physical storage device that stores executable instructions, such as the dynamic resource balancing instructions 522 shown in FIG. 5. As such, the machine-readable medium 520 may be, for example, random access memory (RAM) such as a dynamic RAM (DRAM), flash memory, spin-transfer torque memory, an electrically-erasable programmable read-only memory (EEPROM), a storage drive, an optical disk, and the like.

The system 500 may execute instructions stored on the machine-readable medium 520 through the processor 510. Executing the instructions may cause the system 500 to perform any of the dynamic resource balancing features described herein, including according to any of the features of the dynamic resource balancing engine 110.

For example, execution of the dynamic resource balancing instructions 522 by the processor 510 may cause the system 500 to allocate computing resources to a set of compute engines, each compute engine configured to perform EDA operations on a hierarchical dataset representative of a circuit design and dynamically reallocate a particular computing resource from a first compute engine to a second compute engine based on an operation priority of an EDA operation executed by the second compute engine, an idle indicator for the first compute engine, or a combination of both.

The systems, methods, devices, and logic described above, including the compute engines 101, 102, and 103 as well as the dynamic resource balancing engine 110, may be implemented in many different ways in many different combinations of hardware, logic, circuitry, and executable instructions stored on a machine-readable medium. For example, the compute engines 101, 102, and 103, the dynamic resource balancing engine 110, or combinations thereof, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine readable instructions stored on the medium, which when executed in an endpoint, computer system, or other device, cause the device to perform operations according to any of the description above, including according to any features of the compute engines 101, 102, and 103, the dynamic resource balancing engine 110, or combinations of both.

The processing capability of the systems, devices, and engines described herein, including the compute engines 101, 102, and 103 as well as the dynamic resource balancing engine 110, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:
through a computing system:
allocating computing resources to a set of compute engines, each compute engine configured to perform electronic design automation (EDA) operations on a hierarchical dataset representative of an integrated circuit (IC) design; and
dynamically reallocating a particular computing resource from a first compute engine to a second compute engine based on an operation priority of an EDA operation executed by the second compute engine, an idle indicator for the first compute engine, or a combination of both,
wherein dynamically reallocating the particular computing resource based on the idle indicator for the first compute engine comprises:
identifying that the first compute engine is executing an EDA process that has reached an EDA operation tail that requires execution of particular EDA operations for the EDA process in serial; and
identifying the particular computing resource as an idle resource unused by the first compute engine during the EDA operation tail of the EDA process for which the particular EDA operations for the EDA process are executed in serial.

2. The method of claim 1, wherein dynamically reallocating the particular computing resource based on the operation priority of the EDA operation comprises:
determining that the EDA operation executed by the second compute engine is on a critical execution path of an EDA process and, in response, reallocating the particular compute resource to the second compute engine.

3. The method of claim 1, wherein dynamically reallocating the particular computing resource based on the operation priority of the EDA operation comprises:
determining an operation type of the EDA operation executed by the second compute engine; and
reallocating the particular computing resource to the second compute engine responsive to a determination that the operation type of the EDA operation is a fill operation or multi-patterning operation.

4. The method of claim 1, wherein dynamically reallocating the particular computing resource based on the operation priority of the EDA operation comprises:
determining a circuit layer that the EDA operation executed by the second compute engine operates on; and
reallocating the particular computing resource to the second compute engine responsive to a determination that the circuit layer is a metal 1 or metal 2 layer.

5. A system comprising:
a set of compute engines, each compute engine configured to perform electronic design automation (EDA) operations on a hierarchical dataset representative of an integrated circuit (IC) design; and
a dynamic resource balancing engine configured to:
allocate computing resources to the set of compute engines; and
reallocate a particular computing resource allocated to a first compute engine based on an operation priority of an EDA operation executed by a second compute engine, an idle indicator for the first compute engine, or a combination of both,
wherein the dynamic resource balancing engine is configured to dynamically reallocate the particular computing resource based on the idle indicator for the first compute engine by:
identifying that the first compute engine is executing an EDA process that has reached an EDA operation tail that requires execution of particular EDA operations for the EDA process in serial; and
identifying the particular computing resource as an idle resource unused by the first compute engine during the EDA operation tail of the EDA process for which the particular EDA operations for the EDA process are executed in serial.

6. The system of claim 5, wherein the dynamic resource balancing engine is configured to dynamically reallocate the particular computing resource based on the operation priority of the EDA operation by:
determining that the EDA operation executed by the second compute engine is on a critical execution path of an EDA process and, in response, reallocating the particular compute resource to the second compute engine.

7. The system of claim 5, wherein the dynamic resource balancing engine is configured to dynamically reallocate the particular computing resource based on the operation priority of the EDA operation by:
determining an operation type of the EDA operation executed by the second compute engine; and
reallocating the particular computing resource to the second compute engine responsive to a determination that the operation type of the EDA operation is a fill operation or multi-patterning operation.

8. The system of claim 5, wherein the dynamic resource balancing engine is configured to dynamically reallocate the particular computing resource based on the operation priority of the EDA operation by:

determining a circuit layer that the EDA operation executed by the second compute engine operates on; and reallocating the particular computing resource to the second compute engine responsive to a determination that the circuit layer is a metal 1 or metal 2 layer.

9. A non-transitory machine-readable medium comprising instructions that, when executed by a processor, cause a system to:

allocate computing resources to a set of compute engines, each compute engine configured to perform electronic design automation (EDA) operations on a hierarchical dataset representative of a circuit design; and dynamically reallocate a particular computing resource from a first compute engine to a second compute engine based on an operation priority of an EDA operation executed by the second compute engine, an idle indicator for the first compute engine, or a combination of both, wherein the instructions to dynamically reallocate the particular computing resource based on the idle indicator for the first compute engine comprise instructions that, when executed by the processor, cause the system to:

identify that the first compute engine is executing an EDA process that has reached an EDA operation tail that requires execution of particular EDA operations for the EDA process in serial; and identify the particular computing resource as an idle resource unused by the first compute engine during the EDA operation tail of the EDA process for which the particular EDA operations for the EDA process are executed in serial.

10. The non-transitory machine-readable medium of claim 9, wherein the instructions to dynamically reallocate the particular computing resource based on the operation priority of the EDA operation comprise instructions that, when executed by the processor, cause the system to:

determine that the EDA operation executed by the second compute engine is on a critical execution path of an EDA process and, in response, reallocate the particular compute resource to the second compute engine.

11. The non-transitory machine-readable medium of claim 9, wherein the instructions to dynamically reallocate the particular computing resource based on the operation priority of the EDA operation comprise instructions that, when executed by the processor, cause the system to:

determine an operation type of the EDA operation executed by the second compute engine; and reallocate the particular computing resource to the second compute engine responsive to a determination that the operation type of the EDA operation is a fill operation or multi-patterning operation.

12. The non-transitory machine-readable medium of claim 9, wherein the instructions to dynamically reallocate the particular computing resource based on the operation priority of the EDA operation comprise instructions that, when executed by the processor, cause the system to:

determine a circuit layer that the EDA operation executed by the second compute engine operates on; and reallocate the particular computing resource to the second compute engine responsive to a determination that the circuit layer is a metal 1 or metal 2 layer.

\* \* \* \* \*